(12) United States Patent
Sonokawa et al.

(10) Patent No.: US 9,777,394 B2
(45) Date of Patent: Oct. 3, 2017

(54) METHOD OF PRODUCING SILICON SINGLE CRYSTAL INGOT

(71) Applicant: SHIN-ETSU HANDOTAI CO., LTD., Tokyo (JP)

(72) Inventors: Susumu Sonokawa, Nishigo-mura (JP); Wataru Sato, Shirakawa (JP); Nobuaki Mitamura, Nishigo-mura (JP); Tomohiko Ohta, Shirakawa (JP)

(73) Assignee: SHIN-ETSU HANDOTAI CO., LTD., Tokyo (JP)

( * ) Notice: Subject to any disclaimer, the term of this patent is extended or adjusted under 35 U.S.C. 154(b) by 120 days.

(21) Appl. No.: 14/758,068

(22) PCT Filed: Jan. 31, 2014

(86) PCT No.: PCT/JP2014/000505
§ 371 (c)(1),
(2) Date: Jun. 26, 2015

(87) PCT Pub. No.: WO2014/129123
PCT Pub. Date: Aug. 28, 2014

(65) Prior Publication Data
US 2015/0354089 A1 Dec. 10, 2015

(30) Foreign Application Priority Data
Feb. 22, 2013 (JP) ................................ 2013-032988

(51) Int. Cl.
C30B 15/20 (2006.01)
C30B 15/14 (2006.01)
(Continued)

(52) U.S. Cl.
CPC ............ *C30B 15/203* (2013.01); *C30B 15/04* (2013.01); *C30B 15/14* (2013.01); *C30B 29/06* (2013.01); *H01L 21/3225* (2013.01); *H01L 22/12* (2013.01)

(58) Field of Classification Search
CPC combination set(s) only.
See application file for complete search history.

(56) References Cited

U.S. PATENT DOCUMENTS

2003/0116082 A1   6/2003  Sakurada et al.
2004/0244674 A1*  12/2004  Ono ........................ C30B 15/04
                                                                117/19

(Continued)

FOREIGN PATENT DOCUMENTS

CN    1406292 A    3/2003
CN    101360852 A  2/2009

(Continued)

OTHER PUBLICATIONS

Machine translation of JP2004-15083.*

(Continued)

*Primary Examiner* — Duy Deo
*Assistant Examiner* — Erin Bergner
(74) *Attorney, Agent, or Firm* — Oliff PLC

(57) ABSTRACT

A method of producing silicon single crystal ingot by pulling the silicon single crystal ingot made of an N-region by the CZ method, including: performing an EOSF inspection including a heat treatment to manifest oxide precipitates and selective etching on sample wafer from the silicon single crystal ingot composed of the N-region to measure a density of EOSF; performing a shallow-pit inspection to investigate a pattern of occurrence of a shallow pit; adjusting the pulling conditions according to result of identification of a defect region of the sample wafer by the EOSF and shallow-pit (Continued)

inspections to pull a next silicon single crystal ingot composed of the N-region, wherein in the identification of the defect region, for an N-region, what portion of an Nv-region or Ni-region the defect region corresponds to is also identified.

3 Claims, 5 Drawing Sheets

(51) Int. Cl.
      *C30B 15/04*       (2006.01)
      *C30B 29/06*       (2006.01)
      *H01L 21/322*     (2006.01)
      *H01L 21/66*      (2006.01)

(56) References Cited

U.S. PATENT DOCUMENTS

| | | | |
|---|---|---|---|
| 2006/0174819 A1* | 8/2006 | Mitamura | C30B 29/06 117/13 |
| 2009/0007839 A1 | 1/2009 | Ebara | |
| 2009/0217866 A1* | 9/2009 | Goto | C30B 29/06 117/15 |
| 2010/0031869 A1 | 2/2010 | Iida et al. | |

FOREIGN PATENT DOCUMENTS

| | | |
|---|---|---|
| CN | 101479411 A | 7/2009 |
| JP | 2936916 B2 | 8/1999 |
| JP | 2003209150 A | 7/2003 |
| JP | 2004153083 A | 5/2004 |
| JP | 2007261935 A | 10/2007 |
| JP | 2008222505 A | 9/2008 |
| JP | 2011068531 A | 4/2011 |

OTHER PUBLICATIONS

Feb. 2, 2016 Office Action Issued in Japanese Patent Application No. 2015-501310.
Aug. 25, 2015 International Preliminary Report on Patentability issued in International Patent Application No. PCT/JP2014/000505.
Apr. 22, 2014 International Search Report issued in International Application No. PCT/JP2014/000505.
Nov. 7, 2016 Office Action issued in Chinese Patent Application No. 201480008259.9.
Nov. 7, 2016 Search Report issued in Chinese Patent Application No. 201480008259.9.
Jun. 13, 2017 Office Action issued in Chinese Patent Application No. 201480008259.9.

* cited by examiner

METHOD OF PRODUCING SILICON SINGLE CRYSTAL INGOT

TECHNICAL FIELD

The present invention relates to a method of pulling and producing a silicon single crystal ingot by the Czochralski method (CZ method), and more particularly to a method of pulling and producing a silicon single crystal ingot composed of an N-region by the CZ method.

BACKGROUND ART

Crystals called COP-free crystals as kinds of wafer products are being increasingly used. This COP-free region (N-region) is a portion which does not include a huge dislocation cluster (I-region), COP (V-region), a defect detectable by Cu deposition, or an oxidation induced stacking fault (OSF) region.

Checking the huge dislocation cluster by etching called LEP in a crystal inspection process, and an Enhanced-OSF (EOSF) inspection are given as methods of guarantee this (See Patent Documents 1 and 2), and identification can be made by these methods.

Production of a silicon single crystal ingot composed of an N-region by the CZ method can be achieved when the ingot is produced at a given growth rate under conditions that maintain a constant temperature gradient near the growth interface in its plane. It is required that F/G be in the range that allows the N-region to be formed on the entire plane, where G is the temperature gradient of a crystal near the growth interface and F is the growth rate (pulling rate) of the crystal. Such a range is narrow. If F or G exceeds the desired requested range, then no N-region is formed, resulting in a failure product.

Thus, this product has a narrow production margin. It is necessary to always monitor which defect region among the V-region, the OSF region, the N-region (Nv-region or Ni-region), and the I-region the production is made with. If necessary, the tuning (adjustment) of pulling conditions is needed. The reason is that since a temperature distribution in a furnace varies over time due to a variation of furnace components to be used, such as heater, insulation, and other components, with time, the tuning of the pulling conditions is essential to stably produce an N-region crystal.

CITATION LIST

Patent Literature

Patent Document 1: Japanese Patent No. 2936916 Patent Document 2: Japanese Unexamined Patent publication (Kokai) No. 2004-153083

SUMMARY OF INVENTION

Technical Problem

The pulling conditions are conventionally adjusted in such a manner that if the huge dislocation cluster (I-region) is generated, then the growth rate F of an N-region silicon single crystal ingot is increased, and if the failure level of defects (V-region or OSF region) are generated by oxidation heat treatment, then the growth rate F is decreased.

However, there is a problem in that this method can adjust the pulling conditions only when the failure occurs.

The present invention was accomplished in view of the above-described problems. It is an object of the present invention to provide a producing method that can adjust the pulling conditions of a silicon single crystal composed of an N-region by the CZ method from an inspection result of a sample wafer, even when no failure occurs.

Solution to Problem

To achieve this object, the present invention provides a method of producing a silicon single crystal ingot by pulling the silicon single crystal ingot composed of an N-region while controlling pulling conditions by a Czochralski, method, comprising: performing an EOSF inspection including a heat treatment to manifest oxide precipitates and selective etching on a sample wafer cut from the pulled silicon single crystal ingot composed of the N-region to measure a density of Enhanced-OSF; performing a shallow-pit inspection to investigate a pattern of occurrence of a shallow pit in the sample wafer subjected to the EOSF inspection; identifying a defect region of the sample wafer by the EOSF inspection and the shallow-pit inspection; and adjusting the pulling conditions according to result of the identification to pull a next silicon single crystal ingot composed of the N-region, wherein in the identification of the defect region, if the defect region is an N-region, what portion of an Nv-region the defect region corresponds to, or what portion of an Ni-region the defect region corresponds to is also identified, and the pulling conditions are adjusted according to the result of the identification.

Performing the above EOSF inspection enables more highly sensitive detection of OSF (Enhanced-OSF) than an inspection by merely performing a conventional OSF heat treatment (e.g., a single oxidation heat treatment at 1100° C. to 1200° C.). The pulling conditions of the N-region silicon single crystal ingot can thereby be adjusted more properly, and the N-region silicon single crystal ingot can be produced with high precision.

In the past, even though a sample wafer from an N-region silicon single crystal ingot pulled under prescribed pulling conditions is identified as passing an inspection in the inspection process (i.e., identified as an N-region by the inspection), when a next N-region silicon single crystal ingot is pulled under the same pulling conditions, and a sample wafer is inspected, the inspection may be failed. The reason is that even when the pulling conditions are determined so as to achieve an N-region, variations in a process that are caused by various factors such as the above variation of furnace components with time cause a change into the V-region or I-region in the production. This problem may occur on condition that the pulling is performed near the interface with the V-region even within an Nv-region, or near the interface with the I-region even within an Ni-region.

Conventionally, the EOSF inspection or other inspection is used only for deciding whether to pass or fail. If the failure level of defects do not occur, the pulling conditions cannot be properly adjusted. Thus, the change of a defect region cannot be predicted, and a failure thereby occurs as above.

Even for the N-region (Nv-region or Ni-region) that is regarded as passing, the inventive producing method however identifies also what portion of the N-region it corresponds to, and adjusts next pulling conditions according to the result of this identification. Unlike the conventional method, the present invention can thereby predict the above change of the defect region and adjust the pulling conditions properly, even when no failure occurs.

For example, when a sample wafer is identified as a portion near the interface with the V-region (a portion on the V-region side of the Nv-region), or a portion near the interface with the I-region (a portion on the I-region side of the Ni-region), the pulling conditions can be adjusted properly so as to prevent unexpected change of the defect region into the V-region or I-region due to variations of a process in the next pulling under the same conditions. The N-region silicon single crystal ingot can accordingly be produced more reliably and stably.

At this time, the heat treatment to manifest the oxide precipitates may include a first heat treatment performed at 900° C. to 1050° C. for 30 to 300 minutes and a second heat treatment subsequently performed at 1100° C. to 1200° C. for 30 to 200 minutes.

Performing the two heat treatments in this way allows OSF to be forcefully produced, enabling highly precise inspection (EOSF inspection).

Moreover, in the identification of the defect region, a relation of the density of the Enhanced-OSF to a V-region and an N-region can be previously investigated, and the V-region and the N-region can be identified on a basis of the relation and the density of the Enhanced-OSF measured in the EOSF inspection.

In this manner, the V-region and the N-region can be more readily identified.

Moreover, in the identification of the defect region, a position of an oxide-precipitates formed region can be decided from the pattern of the occurrence of the shallow pit investigated in the shallow-pit inspection, the oxide-precipitates formed region being formed at an interface between an I-region and an N-region, and the I-region and the N-region can be identified.

In this manner, the I-region and the N-region can be more readily identified.

Moreover, the pulling conditions can be adjusted by adjusting at least one of a pulling rate F of the silicon single crystal ingot composed of the N-region, a distance D between a surface of a melt of raw material and a lower end of a heat shield, a position $P_H$ of a heater to heat the raw material, and a position $P_C$ of a crucible to contain the melt of the raw material.

Adjusting these parameters enables an adjustment of V/G and more proper adjustment of the pulling conditions of the N-region silicon single crystal ingot.

At this time, in the identification of the defect region, if the defect region is identified as a portion on a V-region side of the Nv-region, then the pulling rate F can be decreased, or the distance D can be increased, and if the defect region is identified as a portion on an I-region side of the Ni-region, then the pulling rate F can be increased, or the distance D can be decreased.

In this manner, the pulling can be performed such that the defect region is a portion further away from the V-region in the Nv-region, or a portion further away from the I-region in the Ni-region. Even when the change of the defect region occurs due to the process variations, the defect region can thereby be inhibited from becoming the V-region or I-region. The N-region silicon single crystal ingot can therefore be produced more reliably.

Advantageous Effects of Invention

As described above, the present invention can predict the change of the defect region from the inspection result of the sample wafer to adjust the pulling conditions, even when no failure occurs. In addition, the N-region silicon single crystal ingot can be produced with high precision. Thus, an N-region crystal can be produced stably, and the productivity and yield can be improved.

DESCRIPTION OF EMBODIMENTS

An embodiment of the present invention will be hereinafter described in detail with reference to the figures, but the present invention is not limited to this embodiment.

Figure 2:
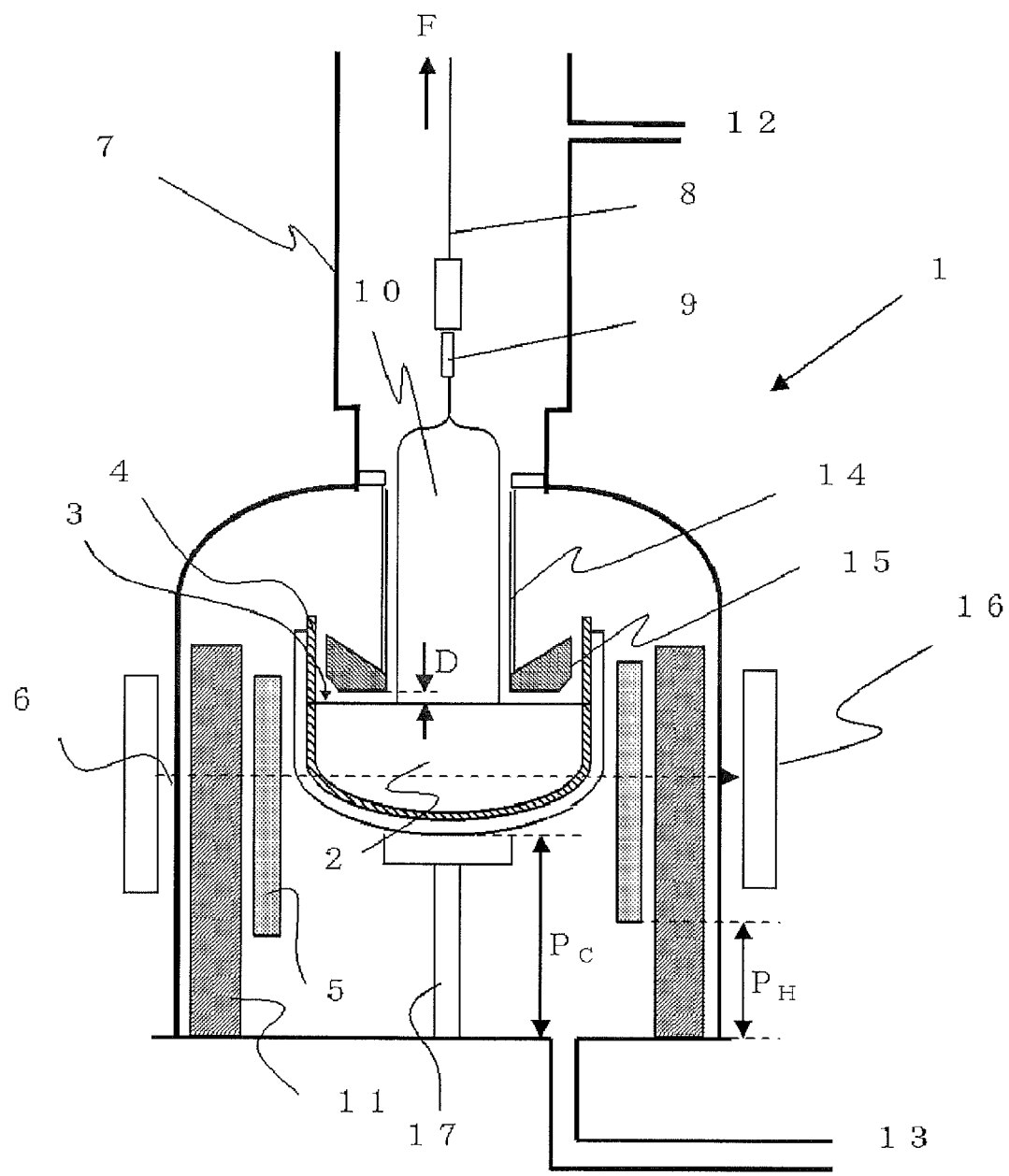
FIG. 2 is a schematic diagram of an exemplary CZ single crystal pulling apparatus that can be used in the inventive producing method.

FIG. 2 shows an exemplary CZ single crystal pulling apparatus that can be used in the inventive method of producing a silicon single crystal ingot.

The CZ single crystal pulling apparatus 1 shown in FIG. 2 is provided with a crucible 4 to contain a melt 2 of raw material (here, although the bottom of a main chamber serves as the standard for the position $P_C$ in height of the crucible, this standard is not particularly limited), a heater 5 to heat and melt a polycrystalline silicon raw material (here, although the bottom of the main chamber serves as the standard for the position $P_H$ in height of the heater, this standard is not particularly limited), and other components, in the main chamber 6. In addition, a pulling mechanism (not shown) to pull a grown single crystal is provided at an upper part of a pulling chamber 7 continuously provided on the main chamber 6.

A wire 8 for pulling is reeled out from the pulling mechanism attached to the upper part of the pulling chamber 7. A seed crystal 9 supported with a seed holder is attached to one end of the wire. The seed crystal 9 is dipped into the raw material melt 2, and the wire 8 for pulling is wound at the pulling rate F with the pulling mechanism so that a single crystal ingot 10 is formed below the seed crystal 9.

Note that the crucible 4 is supported by a crucible rotating shaft 17 that can rotate and move upward and downward by a rotation drive mechanism (not shown) attached to a lower part of the CZ single crystal pulling apparatus 1.

Moreover, a heat insulator 11 is provided outside the heater 5 disposed around the crucible 4.

Moreover, the chambers 6 and 7 are provided with a gas inlet 12 and a gas outlet 13. An argon gas or other gases can be introduced in the interior of the chambers 6 and 7 and discharged.

A gas-flow guiding cylinder 14 extends from at least a ceiling of the main chamber 6 toward the surface 3 of the raw material melt so as to surround the single crystal ingot 10 during pulling. Moreover, a heat shield 15 is provided to shield radiant heat from the heater 5 at between the vicinity of the raw material melt surface 3 and the gas-flow guiding cylinder 14, so that the single crystal ingot 10 is cooled. The heat shield 15 is provided such that its lower end is distance D away from the raw material melt surface 3.

Moreover, a magnetic field applying device 16 can also be disposed horizontally outward of the main chamber 6. This device achieve a CZ single crystal pulling apparatus by the so-called MCZ method, which apply a magnetic field to the raw material melt 2 in the horizontal or vertical direction, or other direction to inhibit the convection of the raw material melt and thereby to grow the single crystal stably.

Figure 1:
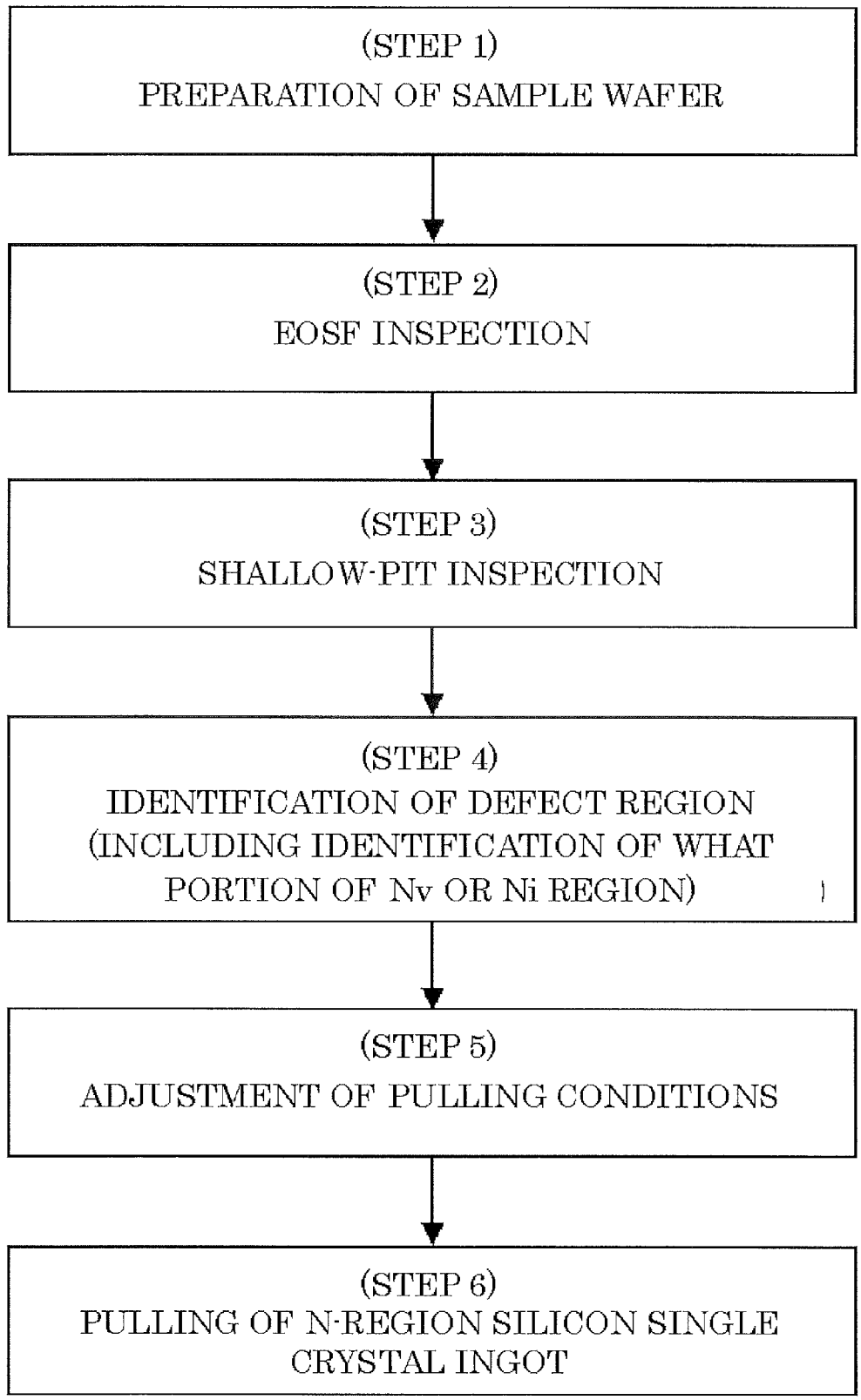
FIG. 1 is a flowchart of an example of the inventive method of producing a silicon single crystal.

FIG. 1 is a flowchart of an example of the inventive method of producing a silicon single crystal ingot. As shown in FIG. 1, there are steps: (Step 1) preparation of a sample wafer; (Step 2) an EOSF inspection; (Step 3) a shallow-pit inspection; (Step 4) identification of a defect region (including identification what portion of the Nv-region or the Ni-region); (Step 5) adjustment of pulling conditions; and (Step 6) pulling of an N-region silicon single crystal ingot.

(Step 1: Preparation of a Sample Wafer)

A silicon single crystal composed of an N-region pulled by the CZ method is cut into wafers with, for example, a wire saw. The preparation is made by taking out some sample wafers from these wafers. The number of the sample wafers to be prepared and the position at which the sample wafers are taken out are not particularly limited, and may be determined appropriately.

(Step 2: EOSF Inspection)

The EOSF inspection is performed on the sample wafers. First, a heat treatment to manifest oxide precipitates is performed. The heat treatment need only be capable of manifesting Enhanced-OSF (also simply referred to as EOSF, below). Specific heat treatment conditions are not particularly limited.

For example, a first heat treatment may be performed at 900° C. to 1050° C. for 30 to 300 minutes and a second heat treatment may be subsequently performed at 1100° C. to 1200° C. for 30 to 200 minutes.

The atmosphere of the heat treatment is not particularly limited. Both the first and second heat treatments can use dry oxygen (dry $O_2$) or wet $O_2$ composed of an $O_2$ gas containing water vapor. The first heat treatment preferably uses dry $O_2$ because of ease of use; the second heat treatment preferably uses wet $O_2$ because the length of OSF becomes longer than a case of using dry $O_2$ and this makes subsequent observation with an optical microscope easy. The rate of increasing temperature and the rate of decreasing temperature in the heat treatment process are not particularly limited, and may be set at 2° C./rain or more.

Performing these two heat treatment enables much more highly sensitive detection of OSF than a conventional OSF heat treatment (for example, a single oxidation heat treatment at 1100° C. to 1200° C.).

Second, the sample wafers after the heat treatment are immersed into a dilute hydrofluoric acid to dissolve and remove an oxide film ($SiO_2$) formed by the heat treatment. A <100> face is then selectively etched (subjected to Secco etching) by immersing into a mixed solution of a 49 percent dilute hydrofluoric acid and a 0.15 mole percent potassium dichromate solution, Secco solution, (composition: 100 cc of HF and 50 cc of a 0.15 mole percent $K_2Cr_2O_7$ solution) for 2 to 30 minutes.

Finally, the etched surface is observed with an optical microscope to measure the density of EOSF (the number of generated OSF having a large diameter per unit area).

(Step 3: Sallow-Pit Inspection)

The sallow-pit inspection is then performed by observing the sample wafers subjected to the EOSF measurement by visual inspection under focused light and checking a pattern of fine defects. The portion at which shallow pits occur has a dark surface. This portion is regarded as having shallow pits.

(Step 4: Identification of a Defect Region)

The defect region of the sample wafers is identified on the basis of the result of the EOSF inspection in the step 2 and the shallow-pit inspection in the step 3. Note that if the identified defect region is an N-region, what portion of the Nv-region the defect region corresponds to or what portion of the Ni-region the defect region corresponds to is also identified.

Figure 3:
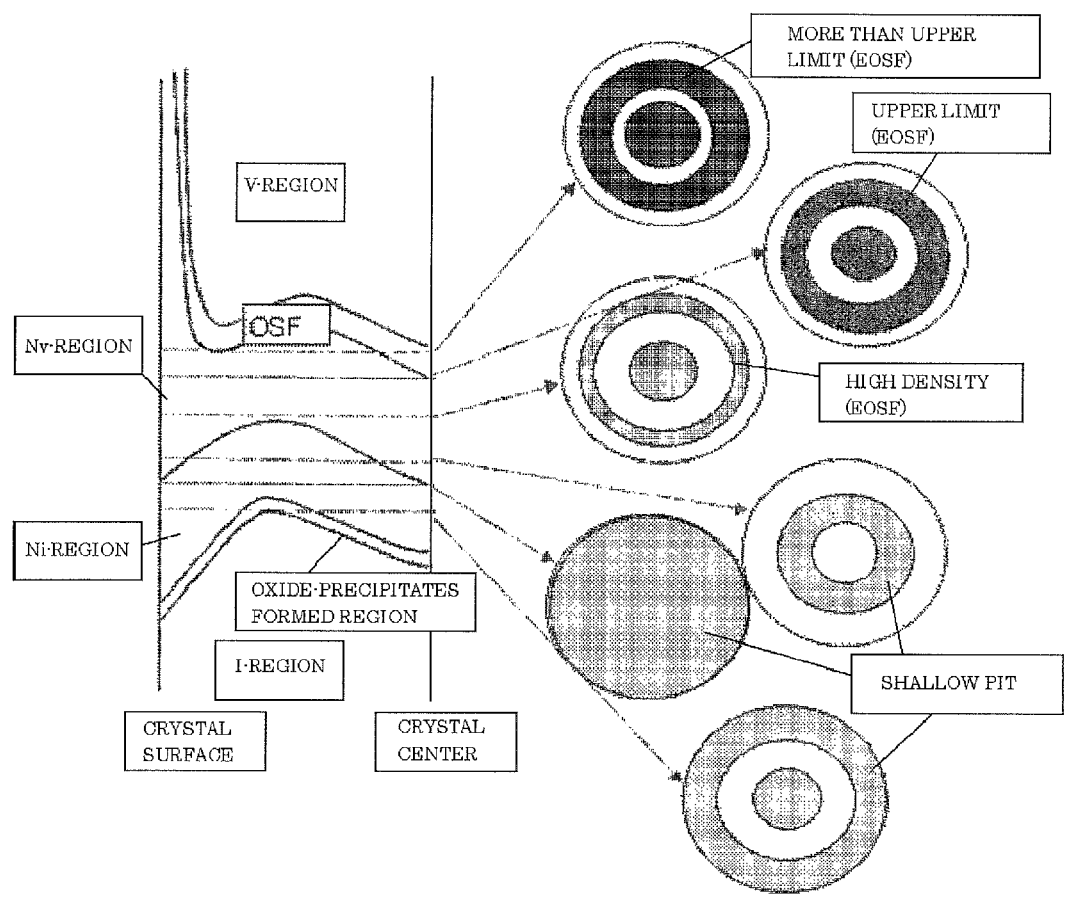
FIG. 3 is an explanatory view of an exemplary relation among defect regions, an EOSF inspection result, and a shallow-pit inspection result.

The relation among the defect region, the EOSF inspection result, the shallow-pit inspection result will now be described with reference to FIG. 3. The left side in FIG. 3 shows a crystal defect distribution in the direction of a pulling axis when a CZ silicon single crystal ingot is grown while the pulling rate is gradually decreased from a high rate. The right side in FIG. 3 shows defect distributions in the plane of wafers cut from the corresponding positions of the single crystal ingot.

First, regarding the result of the EOSF inspection as shown in FIG. 3, the EOSF is detected with a very high density in the V-region, and the OSF region.

Next, the COP-free region (N-region) is classified as the Nv-region, in which vacancies are predominant, or the Ni-region, in which interstitial Si is predominant. In the Nv-region, oxygen precipitation is easy to occur, and high density defects occur in the EOSF inspection. From the fact that this value is larger, it can be identified to be the N-region closer to the V-region. In other words, this is a portion on the V-region side even within the Nv-region.

Moreover, in production from the Nv-region to the Ni-region, the density of EOSF is low at a portion in which the Nv-region and the Ni-region are mixed.

In this manner, what portion of the Nv-region it corresponds to is also identified.

Note that no EOSF is detected in the Ni-region nor in the I-region.

For example, when the EOSF density is given the upper limit and so high that the EOSF density exceeds the upper limit, the defect region of the sample wafer can be regarded as the V-region; when being smaller than the upper limit and equal to or more than one half of the upper limit (high density), the defect region as the Nv-region; when being smaller than one half of the upper limit and more than zero (low density), the defect region as the mixed region of the Nv-region and Ni-region; and when being zero, the defect region as the Ni-region or the I-region.

FIG. 3 shows examples of exceeding the upper limit, the upper limit, and the high density.

Note that these standards of the identification such as the upper limit are naturally not particularly limited, and may be determined appropriately. The defect density in the EOSF inspection is inspected to see a region of oxygen precipitation and depends on oxygen concentration and a defect level. The upper limit may be determined, for example, in the same manner as Patent Document 2 (upper limit Y (number/cm$^2$)=1.3X$^2$-10X, where X is the initial oxygen concentration ppma (ASTM '79)).

Note that it is better to previously investigate the relation of the EOSF density to the V-region and the N-region (especially, the Nv-region). The V-region and the Nv-region can be identified on the basis of the relation (the upper limit etc.,) obtained by this investigation and the EOSF density measured in the EOSF inspection.

Moreover, in the shallow-pit inspection, no shallow pit is detected in the V-region nor the Nv-region. Although natural contamination is produced due to a few impurities from a heat treatment furnace in the heat treatment of EOSF, this heat treatment forms oxide precipitates in the V-region and the Nv-region such that these regions have a gettering ability. In the subsequent shallow-pit inspection, no shallow pit is therefore observed.

In the Ni-region, on the other hand, since shallow pits occur and a pattern of the occurrence can be detected, if the Nv-region and Ni-region are mixed, shallow pits occur in the ring form. In an example of the portion in which the Nv-region and the Ni region are mixed, shown in FIG. 3, the Nv-region exists and no shallow pit occurs in the central portion and the outer circumferential portion in the plane, and the Ni-region exists and the shallow pits in the ring form occur near one half of the radius R in the radial direction.

Moreover, when the entire plane is the Ni-region, the shallow pits occur in the entire plane.

Even for the Ni-region, it can thus be identified whether the portion is on the Nv-region side, which is mixed with the Nv-region or on the I-region side, which is not mixed.

Moreover, there is a region in which oxide precipitates are formed also in the interface between the I-region and the Ni-region. This oxide-precipitates formed region is undetectable by the EOSF inspection, but detectable only by the shallow-pit inspection. Since no shallow pit is detected in this oxide-precipitates formed region, the oxide-precipitates formed region is detected in the ring form (without shallow pits) between the Ni-region and the I-region, in which shallow pits are detected. This is, for example, a condition where no shallow pit occurs in a ring area near one half of the radius R in the radial direction. The position of the oxide-precipitates formed region can therefore be decided from the occurrence pattern of the shallow pits. Whether the defect region of the sample wafer is closer to the I-region in the Ni-region can also be decided from the occurrence pattern of the shallow pits.

In this manner, what portion of the Ni-region it corresponds to is also identified.

(Step 5: Adjustment of Pulling Conditions)

The pulling conditions under which a next N-region silicon single crystal is pulled are adjusted according to result of the identification of the defect region in the step 4.

Control of the value of (pulling rate F)/(temperature gradient G near the crystal growth interface) is important to pull an N-region silicon single crystal. The temperature gradient G near the crystal growth interface can be adjusted by adjusting the distance D between the raw material melt and the lower end of the heat shield, the position $P_H$ of the heater, and the position $P_C$ of the crucible, and so on.

Examples of the adjusting method may include decreasing the pulling rate F or increasing the distance D when the identification is made as being a portion on the V-region side in the Nv-region. The pulling can thereby be performed such that the defect region is a portion further away from the V-region. In other words, a crystal to be grown can be prevented from changing into the V-region due to process variations caused by the various factors as described previously.

Note that when the identification is made as being the V-region, the adjustment can be performed in the same manner; in this case, a larger adjustment range is better for a change from the V-region into the N-region.

Figure 4:
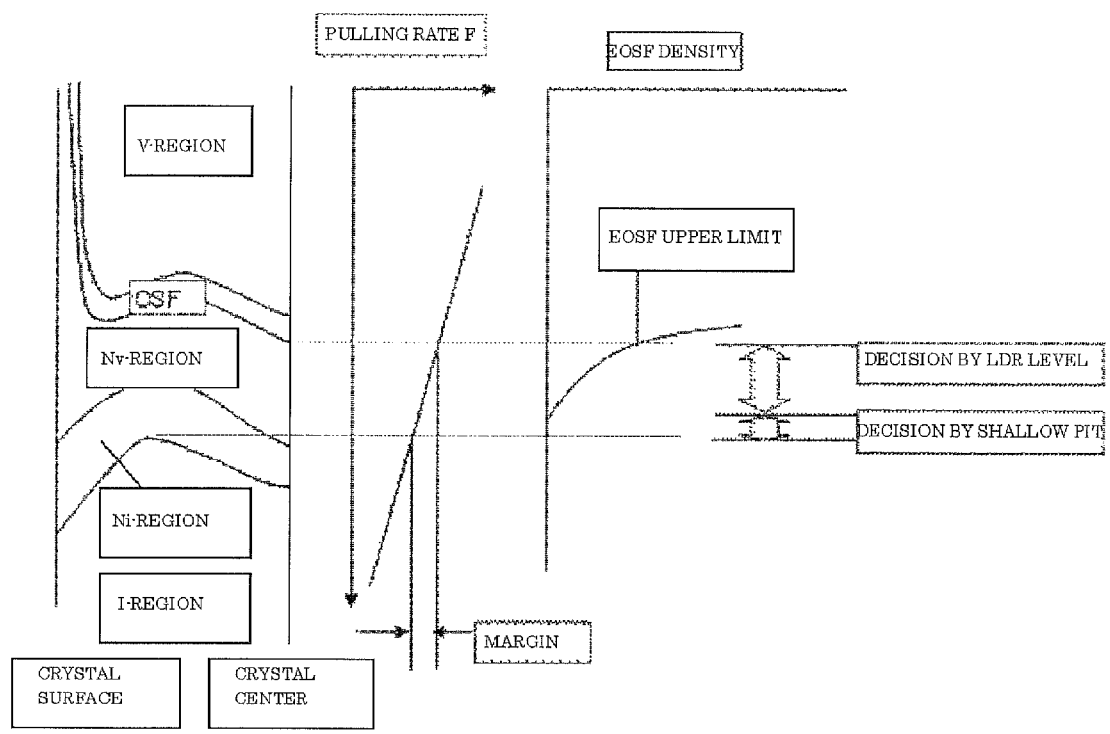
FIG. 4 is an explanatory view of an exemplary relation between a pulling rate and defect regions.

On the contrary, when the identification is made as being a portion on the I-region side in the Ni-region, the pulling rate F can be increased or the distance D can be decreased. The pulling can thereby be performed such that the defect region is a portion further away from the I-region. In other words, the change into the I-region due to process variations can be prevented. FIG. 4 shows an example of the relation between the pulling rate and the defect region.

Note that when the identification is made as being the I-region, the adjustment can also be performed in the same manner; in this case, a larger adjustment range is better for a change from the I-region into the N-region.

These methods allow an N-region silicon single crystal to be pulled more reliably in a stable manner.

Other than that, the position $P_H$ of the heater or the position $P_C$ of the crucible may be adjusted. More specifically, relatively raising the position $P_H$ of the heater and lowering the position $P_C$ of the crucible can achieve the same effect as rising the pulling rate. On the contrary, relatively lowering the position $P_H$ of the heater and raising the position $P_C$ of the crucible can achieve the same effect as lowering the pulling rate. These parameters may be adjusted alone; a plurality of the parameters may be adjusted at the same time according to other reasons of single crystal quality.

(Step 6: Pulling of an N-Region Silicon Single Crystal Ingot)

A polycrystalline raw material is charged into the crucible 4 of the CZ single crystal pulling apparatus 1 shown in FIG. 2, heated and melted by the heater 5 to obtain the raw material melt 2. Next, the seed crystal 9 is dipped into the raw material melt 2 and then pulled to produce the N-region silicon single crystal ingot 10 by the CZ method. Specific pulling conditions at this time are the adjusted pulling conditions in the step 5.

The conventional method uses the EOSF inspection or other inspection only for deciding whether to pass or fail the inspection, and adjusts the pulling conditions only after failure occurs. The present invention identifies whether to be near the V-region or the I-region even when no failure occurs (in the N-region), not to mention the cases where failure occurs, and can adjust the pulling conditions so as to prevent failure due to the change into the V-region or the I-region even when the process variations occur. The N-region silicon single crystal can thereby be produced more reliably than the conventional method.

EXAMPLE

The present invention will be more specifically described below with reference to examples and comparative examples, but the present invention is not limited to these examples.

Example 1

The inventive method of producing a silicon single crystal ingot shown in FIG. 1 was implemented.

The EOSF inspection and the shallow-pit inspection were performed on sample wafers from an N-region silicon single crystal ingot by the CZ method, and the defect region was identified. The pulling conditions were adjusted on the basis of the identification result so as to achieve the pulling of an N-region more reliably. A next N-region silicon single crystal ingot was then produced under the adjusted pulling conditions.

Note that a first heat treatment was first performed at 900° C. under dry $O_2$ for 60 minutes and a second hear treatment was next performed at 1200° C. under wet $O_2$ for 100 minutes, as the EOSF inspection.

Moreover, after an oxide film on the surface was removed, a <100> face is selectively etched by immersing into a mixed solution of a 49 percent dilute hydrofluoric acid and a 0.15 mole percent potassium dichromate solution, Secco solution (composition: 100 cc of HF and a 50 cc of a 0.15 mole percent $K_2Cr_2O_7$ solution), for 10 minutes. The etched surface was observed by an optical microscope to measure the density of EOSF.

Moreover, the sample wafers subjected to the EOSF measurement were observed by visual inspection under focused light as the shallow-pit inspection, and a pattern of fine defects was checked to investigate the occurrence pattern of shallow pits.

In the identification of the defect region, the upper limit of the EOSF density (the interface between the V-region and the N-region) was set at $1.3X^2-10X$ (number/$cm^2$), where X was the initial oxygen concentration ppma (ASTM '79) as in Patent Document 2.

above special pattern of shallow pits are detected is represented by $F_2$, and $F_0$ is defined by $F_1$-$F_2$. The density (upper limit) of EOSF, which is a standard for deciding whether to pass or fail, is represented by $EOSF_1$.

Note that for reference, also shown are the result of an OSF inspection (defects that occur in the ring form by oxidation at 1100° C. to 1200° C.) as shown in later-described comparative example 1, and the result of a LEP inspection (defects that are observed by selective etching with Secco solution or chemical solution with a 400:2 to 4:10 to 50:80 volume ratio of hydrofluoric acid:nitric acid: acetic acid:water in the etching solution, containing 0.03 g or more of iodine or an iodide per litter of the total amount of the etching solution, disclosed in Japanese Unexamined Patent publication (Kokai) No. 2003-209150).

TABLE 1

| DEFECT REGION | EOSF DENSITY | OCCURRENCE PATTERN OF SHALLOW PIT | DECISION OF PASS OR FAIL | ADJUSTMENT OF PULLING RATE | OSF | LEP |
|---|---|---|---|---|---|---|
| V-REGION AND OSF-REGION EXIST | >$EOSF_1$ (MORE THAN UPPER LIMIT) | NONE | FAIL | -$F_0$/2 OR MORE | EXIST | NONE |
| Nv-REGION | $EOSF_1$~$EOSF_1$/2 (HIGH DENSITY) | | PASS | -$F_0$/3 | NONE | NONE |
| Nv AND Ni REGIONS COEXIST | $EOSF_1$/2~0 (LOW DENSITY) | RING PATTERN (NO DEFECT AT CENTER OR PERIPHERY IN PLANE) | PASS | ±0 | NONE | NONE |
| Ni-REGION | 0 | DEFECTS IN ENTIRE PLANE | PASS | +$F_0$/5 | NONE | NONE |
| I-REGION AND OXIDE-PRECIPITATES FORMED REGION EXIST | 0 | RING PATTERN (NO DEFECT NEAR ONE HALF OF RADIUS R IN RADIAL DIRECTION) | FAIL | +$F_0$/3 | NONE | EXIST |

Moreover, even when identified as being the N-region and regarded as passing, a portion of the N-region to which it corresponded was also identified, and the pulling conditions were adjusted accordingly.

If the value of EOSF is close to the upper limit drawn from oxygen, as described previously, then the portion is close to the V-region even when being the COP-free Nv-region; in production of a next single crystal ingot, the process variations may change it into the V-region. On the other hand, if there is no EOSF and the shallow pits are detected in the entire surface, then the portion is comparatively close to the I-region even when being the COP-free Ni-region; in production of a next single crystal ingot, the process variations may then change it into the I-region. In view of these, the pulling rate was adjusted even in the case of the Nv-region or Ni-region.

Moreover, for the V-region, this case was regarded as failing, and the pulling rate was decreased. In the case of shallow pits including the special pattern (an oxide-precipitates formed region present at the interface between the I-region and the Ni-region) that does not appear in the COP-free region, this case was regarded as failing, and the pulling rate was increased.

Table 1 shows the result of the EOSF inspection, the result of the shallow-pit inspection, the identification of the defect region, and the method of adjusting the pulling conditions (adjusting the pulling rate, here).

The rate at which OSFs appear in the wafer plane is represented by $F_1$, the rate at which LEPs appear or the Example 2

The pulling rate was adjusted as in example 1, an in-plane distribution was adjusted from the result of the EOSF inspection and the shallow-pit inspection, and a margin for pulling of an N-region was optimized to produce an N-region silicon single crystal ingot.

Figure 5:
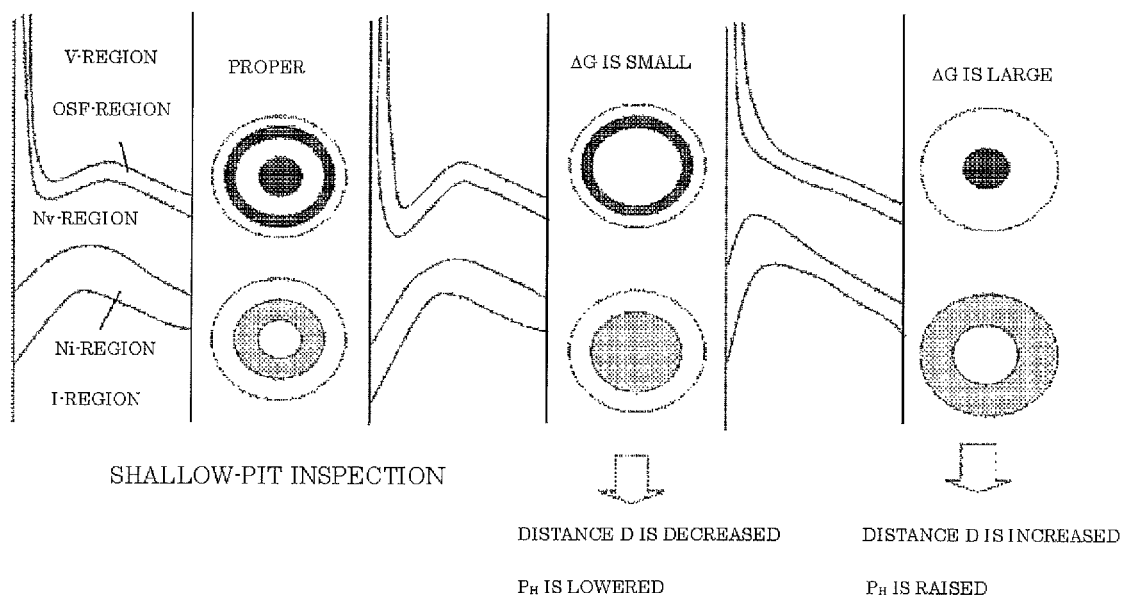
FIG. 5 is an explanatory view of an exemplary relation among distance D, adjustment of heater position $P_H$, an EOSF inspection, and a shallow-pit inspection result (Example 2).

As shown in FIG. 5, when EOSF defects were generated at a central portion, or shallow pits were generated at a circumferential portion, the distance D was increased, or the position $P_H$ of the heater was raised. In the opposite case, the opposite adjustment was made.

Regarding values to be changed, the distance D was adjusted with a proportion of 5%, and the limit of the heating position was 10% of the depth of the melt.

Note that although in here the setting was described above, this pattern results from the production method; thus, when the pulling rate and the occurrence pattern of the crystal defects are different, the identification standards need to be decide accordingly.

Comparative Example 1

A LEP inspection, an OSF inspection, and a Cu deposition inspection were performed on sample wafers from an N-region silicon single crystal ingot by the CZ method, and whether to pass or fail was decided.

Note that LEP is a defect that is observed by selective etching with Secco solution or chemical solution with a 400:2 to 4:10 to 50:80 volume ratio of hydrofluoric acid: nitric acid:acetic acid:water in the etching solution, containing 0.03 g or more of iodine or an iodide per litter of the total amount of the etching solution, disclosed in Japanese Unexamined Patent publication (Kokai) No. 2003-209150; when the defect is seen, this case is regarded as failing.

The OSF is regarded as failing when ring defects are observed by oxidation at 1100° C. to 1200° C.

Moreover, the Cu deposition is a method of observing defects by applying voltage to a wafer having a oxide film in a solution containing Cu ions and precipitating copper on crystal defect portions; when the ring defects are observed, this case is regarded as failing (See Japanese Unexamined Patent publication (Kokai) No. 2002-201093).

Then, feedback about the passing or failing result was given on the pulling conditions to produce a next N-region silicon single crystal ingot.

Note that in the case of an LEP failure, the pulling rate was increased by one half of the margin; in the case of an OSF failure and a Cu deposition failure, the pulling rate was decreased by one half of the margin.

Comparative Example 2

The same EOSF inspection as in example 1, and the same LEP inspection as in comparative example 1 were performed on sample wafers from an N-region silicon single crystal ingot by the CZ method, and whether to pass or fail was decided.

When exceeding the upper limit of EOSF and a failure of LEP occurred, the pulling rate was adjusted.

Note that in the case of the LEP failure, the pulling rate was increased by one half of the margin; in the case of exceeding the upper limit of EOSF, the pulling rate was decreased by one half of the margin.

Table 2 shows the pass rate of defects in these N-region silicon single crystal ingots pulled in examples 1 and 2 and comparative examples 1 and 2. This shows a percentage of the number of the crystals in which no failure occurred with respect to the total number of the produced crystals.

TABLE 2

| | COMPARATIVE EXAMPLE 1 | COMPARATIVE EXAMPLE 2 | EXAMPLE 1 | EXAMPLE 2 |
|---|---|---|---|---|
| PASS RATE OF DEFECT | 50% | 80% | 90% | 98% |

It can be seen that example 1, furthermore example 2, in which the present invention was carried out, exhibited a significantly higher value than comparative examples 1 and 2 according to the conventional method, which means an N-region silicon single crystal ingot can be reliably produced by examples 1 and 2. The present invention can produce an N-region silicon single crystal ingot stably more than conventionally, and reduce the number of poor quality products. The yield can thereby be improved and the production cost can be reduced.

It is to be noted that the present invention is not limited to the foregoing embodiment. The embodiment is just an exemplification, and any examples that have substantially the same feature and demonstrate the same functions and effects as those in the technical concept described in claims of the present invention are included in the technical scope of the present invention.

For example, although example 1 exemplified also the case where sample wafers contained a portion at which a failure such as the V-region or I-region occurred, in addition to the N-region. The present invention can adjust the pulling conditions to more proper values from the EOSF density and the occurrence pattern of shallow pits and produce an N-region silicon single crystal ingot more reliably, even when such a failure does not occur.

The invention claimed is:

1. A method of producing a silicon single crystal ingot by pulling the silicon single crystal ingot composed of an N-region while controlling pulling conditions by a Czochralski method, comprising:
    performing an EOSF inspection comprising a heat treatment to manifest oxide precipitates and selective etching on a sample wafer cut from the pulled silicon single crystal ingot composed of the N-region to measure a density of Enhanced-OSF, the heat treatment to manifest the oxide precipitates comprises a first heat treatment performed at 900° C. to 1050° C. for 30 to 300 minutes and a second heat treatment subsequently performed at 1100° C. to 1200° C. for 30 to 200 minutes;
    performing a shallow-pit inspection to investigate a pattern of occurrence of a shallow pit in the sample wafer subjected to the EOSF inspection;
    identifying a defect region of the sample wafer by the EOSF inspection and the shallow-pit inspection; and
    adjusting the pulling conditions according to result of the identification to pull a next silicon single crystal ingot composed of the N-region, wherein
    in the identification of the defect region,
        a relation of the density of the Enhanced-OSF to a V-region and an N-region is previously investigated, and the V-region and the N-region are identified on a basis of the relation and the density of the Enhanced-OSF measured in the EOSF inspection;
        a position of an oxide-precipitates formed region is decided from the pattern of the occurrence of the shallow pit investigated in the shallow-pit inspection, the oxide-precipitates formed region being formed at an interface between an I-region and an N-region, and the I-region and the N-region are identified; and
    if the defect region is an N-region, what portion of an Nv-region the defect region corresponds to, or what portion of an Ni-region the defect region corresponds to is also identified, and the pulling conditions are adjusted according to the result of the identification.

2. The method according to claim 1, wherein the pulling conditions are adjusted by adjusting at least one of a pulling rate F of the silicon single crystal ingot composed of the N-region, a distance D between a surface of a melt of raw material and a lower end of a heat shield, a position $P_H$ of a heater to heat the raw material, and a position Pc of a crucible to contain the melt of the raw material.

3. The method according to claim 2, wherein in the identification of the defect region, if the defect region is identified as a portion on a V-region side of the Nv-region, then the pulling rate F is decreased, or the distance D is increased, and if the defect region is identified as a portion on an I-region side of the Ni-region, then the pulling rate F is increased, or the distance D is decreased.

* * * * *